(12) United States Patent
Halpin

(10) Patent No.: US 10,186,450 B2
(45) Date of Patent: Jan. 22, 2019

(54) APPARATUS AND METHOD FOR ADJUSTING A PEDESTAL ASSEMBLY FOR A REACTOR

(71) Applicant: ASM IP HOLDING B.V., Almere (NL)

(72) Inventor: Michael Halpin, Scottsdale, AZ (US)

(73) Assignee: ASM IP HOLDING B.V. (NL)

( * ) Notice: Subject to any disclaimer, the term of this patent is extended or adjusted under 35 U.S.C. 154(b) by 1108 days.

(21) Appl. No.: 14/336,685

(22) Filed: Jul. 21, 2014

(65) Prior Publication Data

US 2016/0020137 A1   Jan. 21, 2016

(51) Int. Cl.
| | |
|---|---|
| *H01L 21/68* | (2006.01) |
| *H01L 21/687* | (2006.01) |
| *B23P 19/04* | (2006.01) |
| *F16D 1/02* | (2006.01) |
| *F16D 1/033* | (2006.01) |
| *F16D 1/12* | (2006.01) |

(52) U.S. Cl.
CPC .......... *H01L 21/68792* (2013.01); *F16D 1/02* (2013.01); *F16D 1/033* (2013.01); *F16D 1/12* (2013.01); *B23P 19/04* (2013.01); *H01L 21/68* (2013.01); *Y10T 29/49826* (2015.01)

(58) Field of Classification Search
CPC ..... H01L 21/68; H01L 21/68792; F16D 1/02; Y10T 29/49826; B23P 19/04
USPC .......................................................... 29/428
See application file for complete search history.

(56) References Cited

U.S. PATENT DOCUMENTS

| | | | | |
|---|---|---|---|---|
| 4,891,526 | A * | 1/1990 | Reeds ................ | G03F 7/70716 250/442.11 |
| 5,509,185 | A * | 4/1996 | Petkov .................... | B23P 19/04 29/252 |
| 5,556,476 | A * | 9/1996 | Lei .................... | C23C 16/45519 118/728 |
| 5,855,675 | A * | 1/1999 | Doering ................. | C23C 16/44 118/719 |
| 6,068,317 | A * | 5/2000 | Park ........................ | H01L 21/68 294/65 |
| 6,174,377 | B1 * | 1/2001 | Doering ................. | C23C 16/44 118/715 |
| 2008/0179297 | A1 * | 7/2008 | Bailey ............... | H01J 37/32366 219/69.15 |
| 2009/0272719 | A1 * | 11/2009 | Collins ................... | C30B 25/12 216/58 |
| 2010/0198550 | A1 * | 8/2010 | Schauer ............... | C23C 14/505 702/145 |
| 2010/0224130 | A1 * | 9/2010 | Smith ................. | C23C 16/4584 118/725 |
| 2012/0164834 | A1 * | 6/2012 | Jennings ........... | H01J 37/32082 438/694 |
| 2012/0304928 | A1 | 12/2012 | Koelmel et al. | |

(Continued)

*Primary Examiner* — Moshe Wilensky
*Assistant Examiner* — Darrell C Ford
(74) *Attorney, Agent, or Firm* — Sand & Sebolt

(57) ABSTRACT

The invention is directed to an alignment assembly for changing the relative position of a plate of a pedestal assembly with respect to a processing chamber of a reactor. The alignment assembly is connected at a first end to a riser shaft of the heating assembly and at a second end to a drive shaft. One or more portions of the alignment assembly may be selectively axially rotated or laterally moved change the relative position of the plate with respect to the processing chamber as desired.

14 Claims, 16 Drawing Sheets

(56) References Cited

U.S. PATENT DOCUMENTS

2013/0019650 A1* 1/2013 Rogers ................ B21D 5/0209
                                                    72/389.3
2013/0230814 A1   9/2013 Dunn et al.
2015/0214039 A1* 7/2015 Manna ............. H01L 21/02164
                                                    438/790

* cited by examiner

APPARATUS AND METHOD FOR ADJUSTING A PEDESTAL ASSEMBLY FOR A REACTOR

BACKGROUND OF THE INVENTION

1. Technical Field

The present invention relates to a pedestal assembly having a riser shaft extending from a plate. More particularly, the present invention relates to adjusting the riser shaft to change the positional properties of the plate. Specifically, the present invention relates to an alignment assembly disposed between the riser shaft and a drive shaft for use in changing the relative position of the plate of the pedestal assembly within a processing chamber of a reactor such that a more precise alignment, and uniform spacing can be made between the plate and the internal walls of the reactor.

2. Background Information

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in systems where the wafer and susceptors absorb heat from a heater.

Some of the important controlled conditions for processing include, but are not limited to, fluid flow rate into the chamber, temperature of the reaction chamber, temperature of the fluid flowing into the reaction chamber, and wafer position on the susceptor.

Heating within the reaction chamber can occur in a number of ways, including lamp banks or arrays positioned above the substrate surface for directly heating the susceptor or susceptor heaters/pedestal heaters positioned below the susceptor. Traditionally, the pedestal style assembly extends into the chamber through a bottom wall and the susceptor is mounted on a plate of the pedestal assembly. The plate may include a resistive heating mechanism enclosed within the plate to provide conductive heat and increase the susceptor temperature. Alternatively, the system may provide for a heat lamp above the plate to heat the wafer from above within the reaction chamber.

The pedestal style assembly resembles a shaft extending from a disk which encloses the heating mechanism. The susceptor may be connected to the disk and the wafer is placed in or on the susceptor, for example, within a wafer-shaped recessed area defined by the susceptor, or the wafer may reside in contact with the disk where the wafer pocket is formed into said disk. The pedestal may be rotated about the central longitudinal axis of the shaft to move the disk, susceptor, and wafer axially within the process chamber.

Rotation during processing facilitates an improved and more uniform heat and chemical dissipation upon the wafer disk. However, this process requires the wafer to be concentric with respect to the process chamber as well as parallel with the chamber ceiling, at all rotational angles of the riser shaft. The concentricity and parallelism tolerances are extremely small and critical for the proper application of heat and chemicals within the process chamber. Often a pedestal style heater does not conform to the required tolerances either through manufacturing inadequacies or through normal handling by parties subsequent to the manufacturing, such as inspectors, cleaning houses, and packers. A pedestal style heater which is not within the required tolerances facilitates both lateral runout of the wafer, where the parallelism between the wafer and the chamber ceiling changes while spinning, and radial runout of the wafer, where the wafer is not concentric within the process chamber while spinning. A technician can center the wafer within the chamber and set the wafer parallel to the chamber ceiling before rotation, however, if the pedestal style heater is not within the required tolerances, the wafer will experience lateral and/or radial runout during axial rotation. Thus, there is a tremendous need in the art to compensate for pedestal style heaters which do not conform to required tolerances, particularly with respect to the perpendicularity between the disk and the shaft.

BRIEF SUMMARY OF THE INVENTION

In one aspect, the invention may provide a method of changing the relative position of a plate of a pedestal assembly with respect to a processing chamber of a reactor, the method comprising the steps of: connecting a riser shaft of the pedestal assembly to a first end of an alignment assembly; connecting a drive shaft to a second end of the alignment assembly; and rotating a first portion of the alignment assembly axially to change the relative position of the plate with respect to the processing chamber.

In another aspect, the invention may provide a method of aligning a pedestal assembly with a reactor, the method comprising the steps of: positioning a plate of the pedestal assembly in a processing chamber of the reactor, wherein a heating surface of the plate is disposed at an angle with respect to a showerhead surface of the reactor, and wherein an imaginary longitudinal central axis of the plate is spaced at a distance from an imaginary longitudinal central axis of the processing chamber; disposing a riser shaft of the pedestal assembly through an opening defined by the reactor, whereby a first end of the riser shaft is secured to the plate; connecting a second end of the riser shaft to a first end of an alignment assembly; connecting a drive shaft to a second end of the alignment assembly; and adjusting the alignment assembly to facilitate one or both of decreasing the angle and decreasing the distance.

Aspects and implementations of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning of the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

The foregoing and other aspects, features, and advantages will be apparent to those artisans of ordinary skill in the art from the DESCRIPTION and DRAWINGS, and from the CLAIMS.

BRIEF DESCRIPTION OF THE SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION OF THE INVENTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

A device for use in improving the alignment between a processing chamber of a reactor and a pedestal or plate of a pedestal assembly is shown in FIGS. 2-18 and referred to generally herein as alignment assembly 1. A method of using alignment assembly 1 to improve the alignment between a processing chamber of a reactor and a plate of a pedestal assembly is shown generally in FIGS. 2-18. Various non-novel features found in the prior art relating to susceptor heating are not discussed herein. The reader will readily understand the fundamentals of susceptor heating and wafer processing are well within the prior art and readily understood by one familiar therewith.

Figure 1:
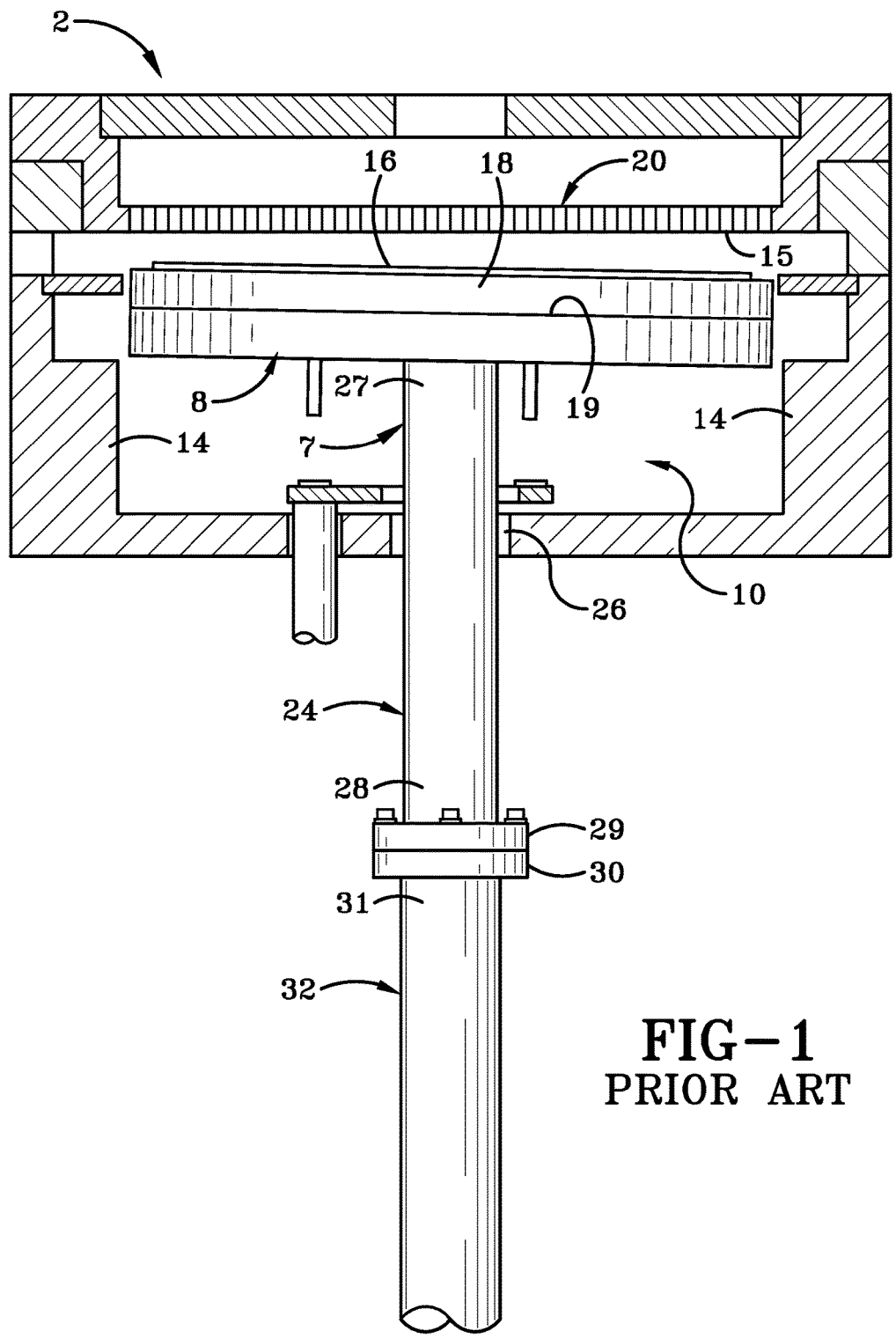
FIG. 1 illustrates a front elevational view of a prior art pedestal assembly coupled with a drive shaft and partially disposed in a reactor with parts cut away.

FIG. 1 illustrates a general state of the prior art with respect to susceptor heaters. FIG. 1 illustrates a reactor 2, which defines a processing chamber 10 therein. Reactor 2 includes a plurality of walls 14 generally surrounding processing chamber 10 and which may be moveable to allow a substrate or wafer 16 to be positioned within processing chamber 10. Specifically, wafer 16 is positioned on a susceptor or substrate support member 18, which rests upon a pedestal assembly 7. Pedestal assembly 7 includes a plate 8 and a riser shaft 24 extending therefrom. Susceptor 18 rests on a surface 19 of plate 8 which extends generally horizontally within processing chamber 10. Susceptor 18 rests on surface 19 to project wafer 16 towards a showerhead 20 having a showerhead surface 15 which extends generally horizontally within processing chamber 10. Plate 8 may envelop a heating mechanism (not shown) for providing a uniform heat distribution to susceptor 18 and ultimately to wafer 16 as susceptor 18 and wafer 16 rest on plate 8.

Showerhead 20 includes various apertures (not shown) and features for selectively expelling a particular gas or gaseous mixture towards wafer 16 when wafer 16 is positioned on susceptor 18 and susceptor 18 is positioned on plate 8. It is strongly preferred in the art that showerhead surface 15 is precisely parallel with surface 19 to produce the most efficient chemical reaction between the gas or gaseous mixture being expelled from showerhead 20 toward the heated wafer 16 therebelow. Even a fraction of a degree off a perfect parallel spaced relationship between showerhead surface 15 and surface 19 creates lateral runout or "wobble" as pedestal assembly 7 is axially rotated in accordance with processing wafer 16. Wafers 16 processed while experiencing lateral runout produce much less usable material and increases overall waste in the system. Oftentimes, the entire wafer is scrapped because of the electrical issues which can be generated by the non-uniformity.

While not shown, the present invention is also suitable for use in a cross-flow reactor, where one side of the reactor includes an inlet and the opposite side includes an exhaust. The gas or gaseous mixture is expelled across the pedestal assembly 7 and wafer 16 from the inlet side to the exhaust side to facilitate a chemical reaction with wafer 16. Cross-flow reactor processing also requires a precisely even surface 19 with minimal lateral runout as pedestal assembly 7 is exposed to the gas or gaseous mixture.

Riser shaft 24 of heating assembly 7 extends from a first end 27 proximate plate 8 through an opening 26 defined by wall 14 and terminates at a second end 28. Inasmuch as the reactor process requires a perfectly parallel spaced relationship between showerhead surface 15 and surface 19, the angle between riser shaft 24 and plate 8 is preferably at a perfect right angle to align plate 8 parallel to showerhead 20. A flange 29 is disposed at second end 28 of riser shaft 24 and configured to be removably connected to a flange 30 disposed at a first end 31 of a drive shaft 32. Drive shaft 32 is axially rotated by a motor or any other kind of rotation mechanism to impart axial rotation into riser shaft 24 and plate 8 as needed during the processing of wafer 16.

Figure 2:
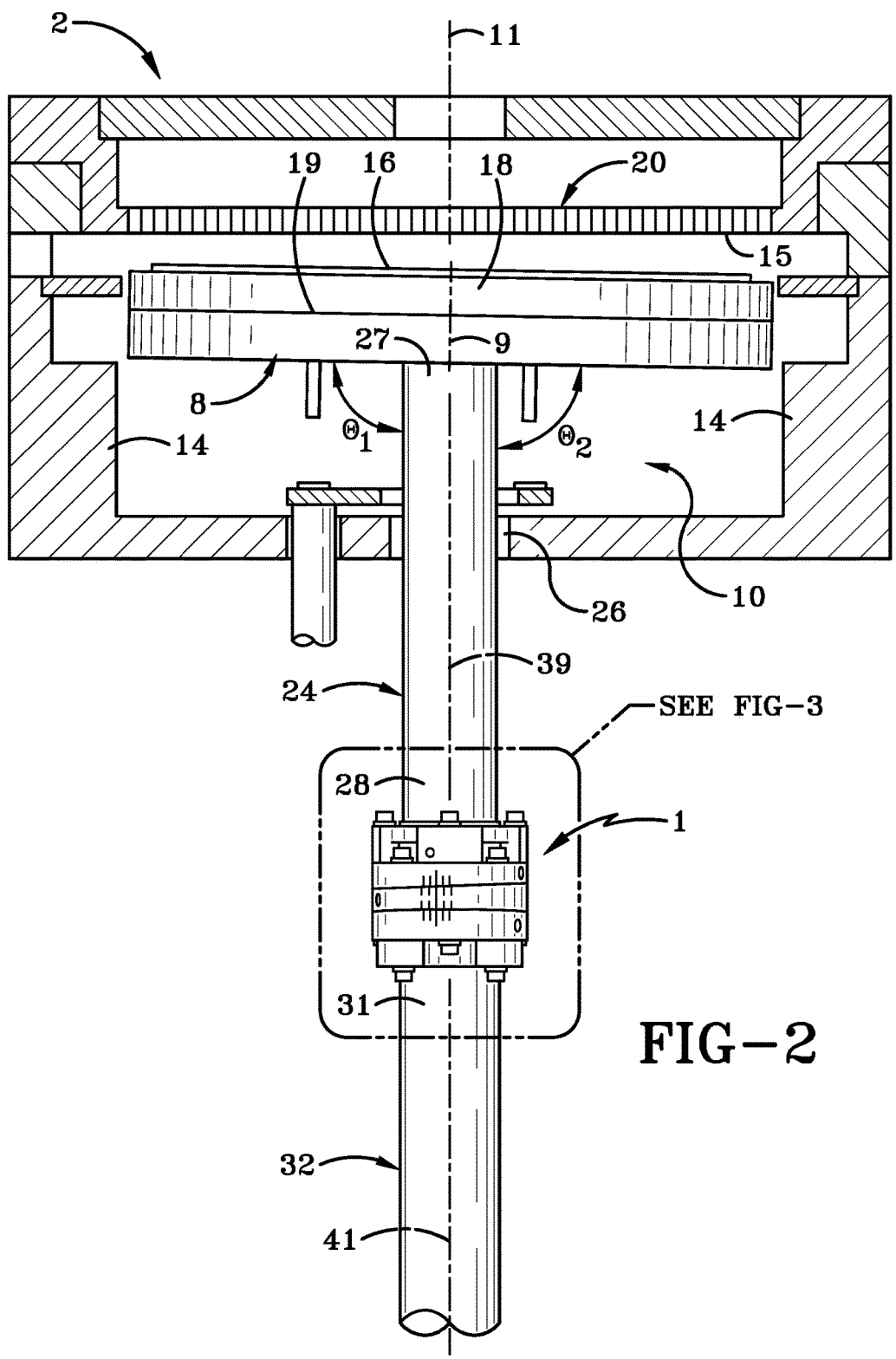
FIG. 2 illustrates a front elevational view of a pedestal assembly partially disposed in a reactor with parts cut away and coupled with a drive shaft by way of an alignment assembly of the present invention.

As shown in FIG. 2, riser shaft 24 is connected with plate 8 ostensibly at a right angle around the circumference of riser shaft 24. However, often this perpendicular connection between riser shaft 24 and plate 8 gets bumped out of precise alignment either in transit or during installation. A misaligned and non-perpendicular connection provides an angle $\Theta_1$ on one side of riser shaft 24 and an angle $\Theta_2$ on the opposite side, where $\Theta_2$ is equal to $180°-\Theta_1$. The non-perpendicular connection between riser shaft 24 and plate 8 propagates into a misaligned wafer 16 by way of surface 19 moving out of parallel alignment with the showerhead surface 15.

As shown in FIG. 2, processing chamber 10 includes an imaginary central axis 11 extending through the symmetrical center of processing chamber 10. Axis 11 represents the precise center of processing chamber. Similarly, plate 8 includes an imaginary central axis 9. Axis 9 represents the precise center of plate 8. It is extremely preferable to have axis 11 precisely aligned with axis 9, indicating that wafer 16 is perfectly centered within processing chamber 10. Any offset between axis 9 and axis 11 creates radial runout during the axial rotation of heating assembly 7 by drive shaft 32. One will readily recognize that axis 11 and axis 9 are misaligned in FIG. 2 due to a non-perpendicular relationship between plate 8 and riser shaft 24. To illustrate, riser shaft 24 includes an imaginary longitudinal central riser axis 39 and drive shaft 32 includes an imaginary longitudinal central shaft axis 41. Riser axis 39 and drive shaft axis 32 are shown in FIG. 2 with a particular orientation with respect to one another. Alignment assembly 1 is configured to selectively change the orientation of riser axis 39 and shaft axis 32 to more closely align central axis 9 of plate 8 with central axis 11 of processing chamber 10 as well as more closely align surface 19 parallel to showerhead surface 15.

FIG. 2 illustrates the misalignment of plate 8 with processing chamber 10 due to riser shaft 24 having a $\Theta_1$ and $\Theta_2$ which are not equal 90°. As such, imaginary central axis 9 is not aligned with imaginary central axis 11. Further, surface 19 is not parallel with showerhead surface 15. Thus, when pedestal assembly 7 having the relative angles between plate 8 and riser shaft 24 shown in FIG. 2 is axially rotated within processing chamber 10, substrate 16 rotates with both a radial runout and a lateral runout. Inasmuch as the connection between riser shaft 24 and plate 8 is permanent, alignment assembly 1 is provided to account for the misalignment and reposition plate 8 and substrate 16 into proper alignment in processing chamber 10 and to minimize or neutralize both radial runout and lateral runout of plate 8 with respect to processing chamber 10.

Figure 3:
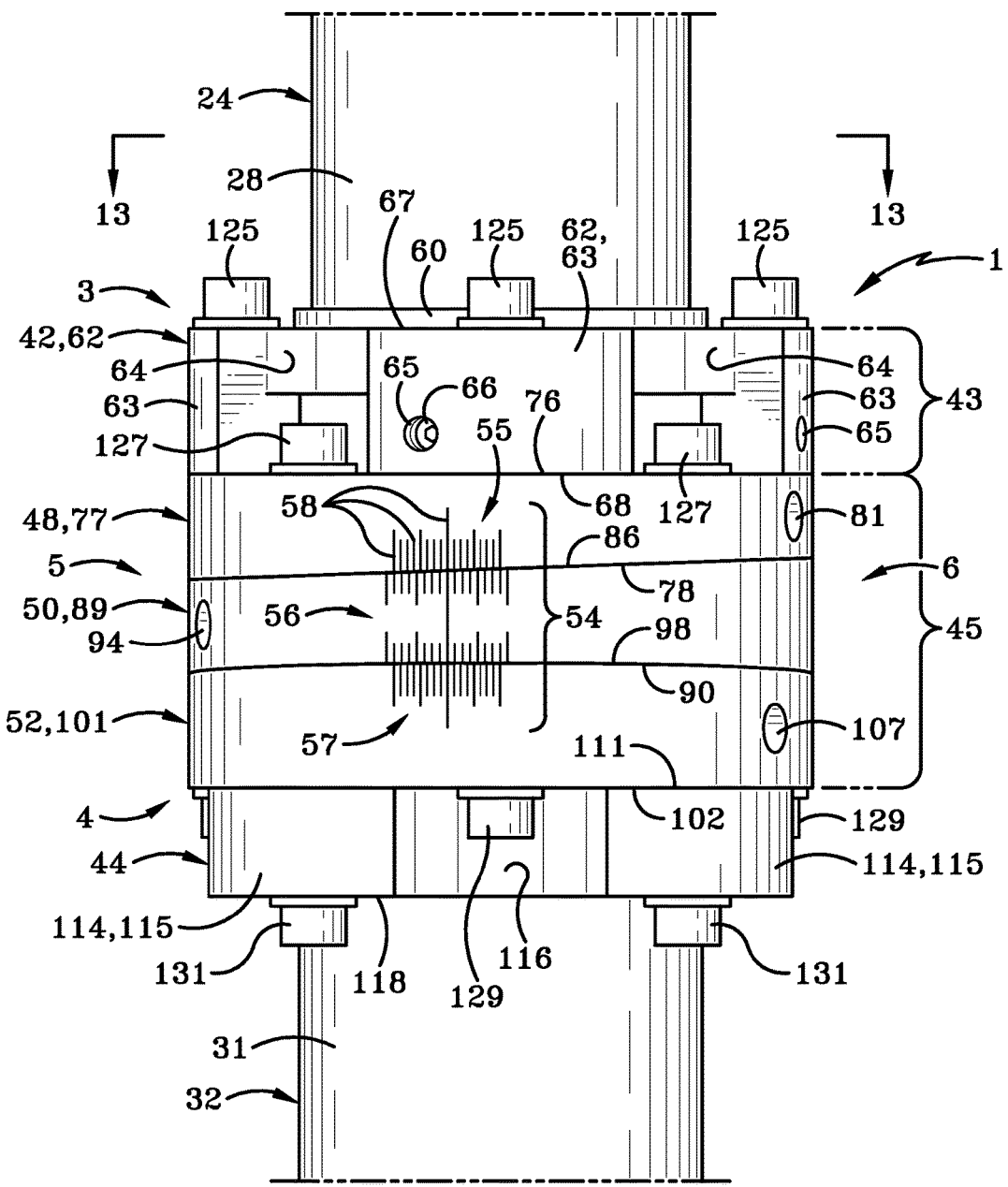
FIG. 3 illustrates an enlarged front elevational view of the alignment assembly of the present invention.
Figure 4:
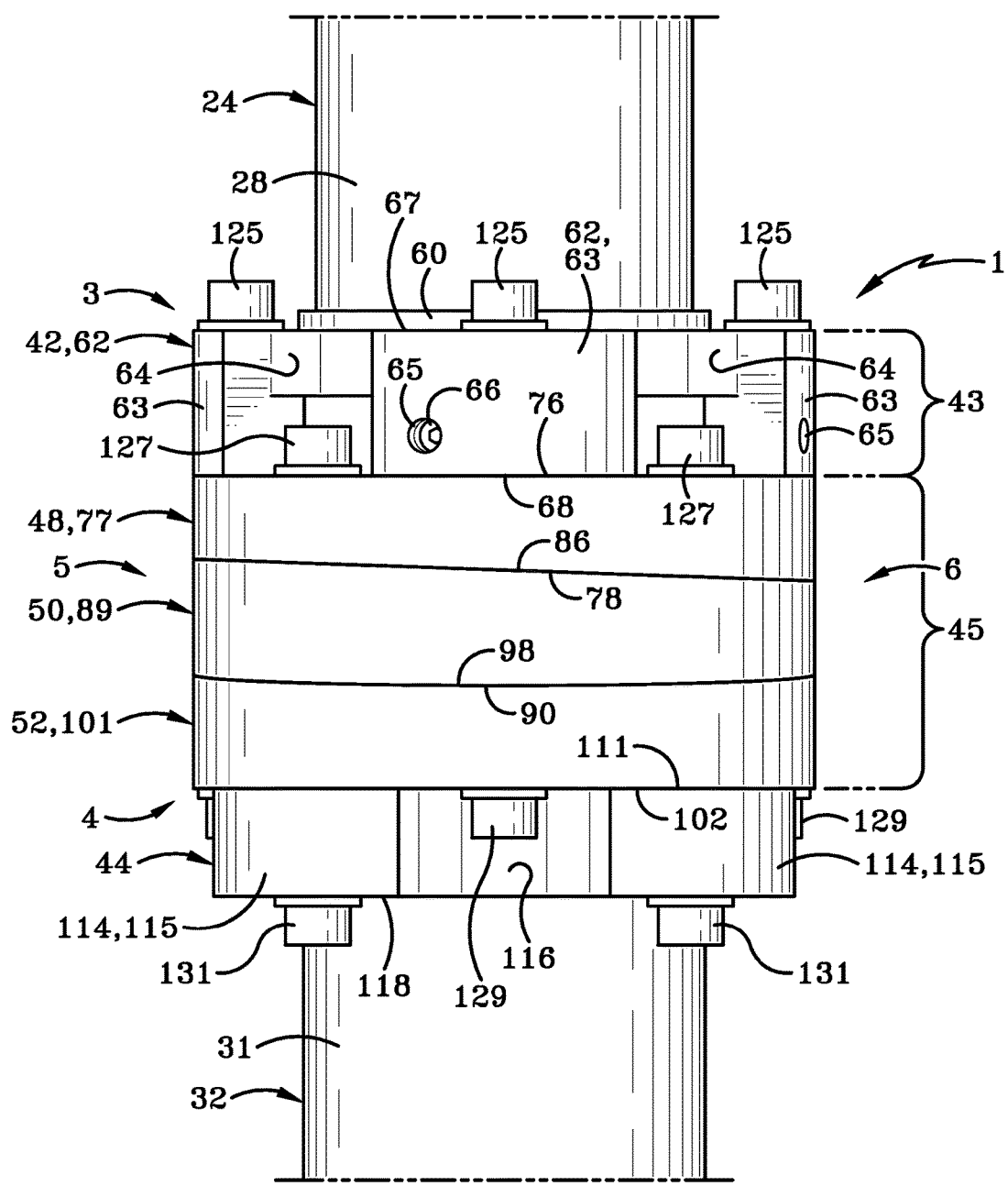
FIG. 4 illustrates a rear elevational view thereof.
Figure 5:
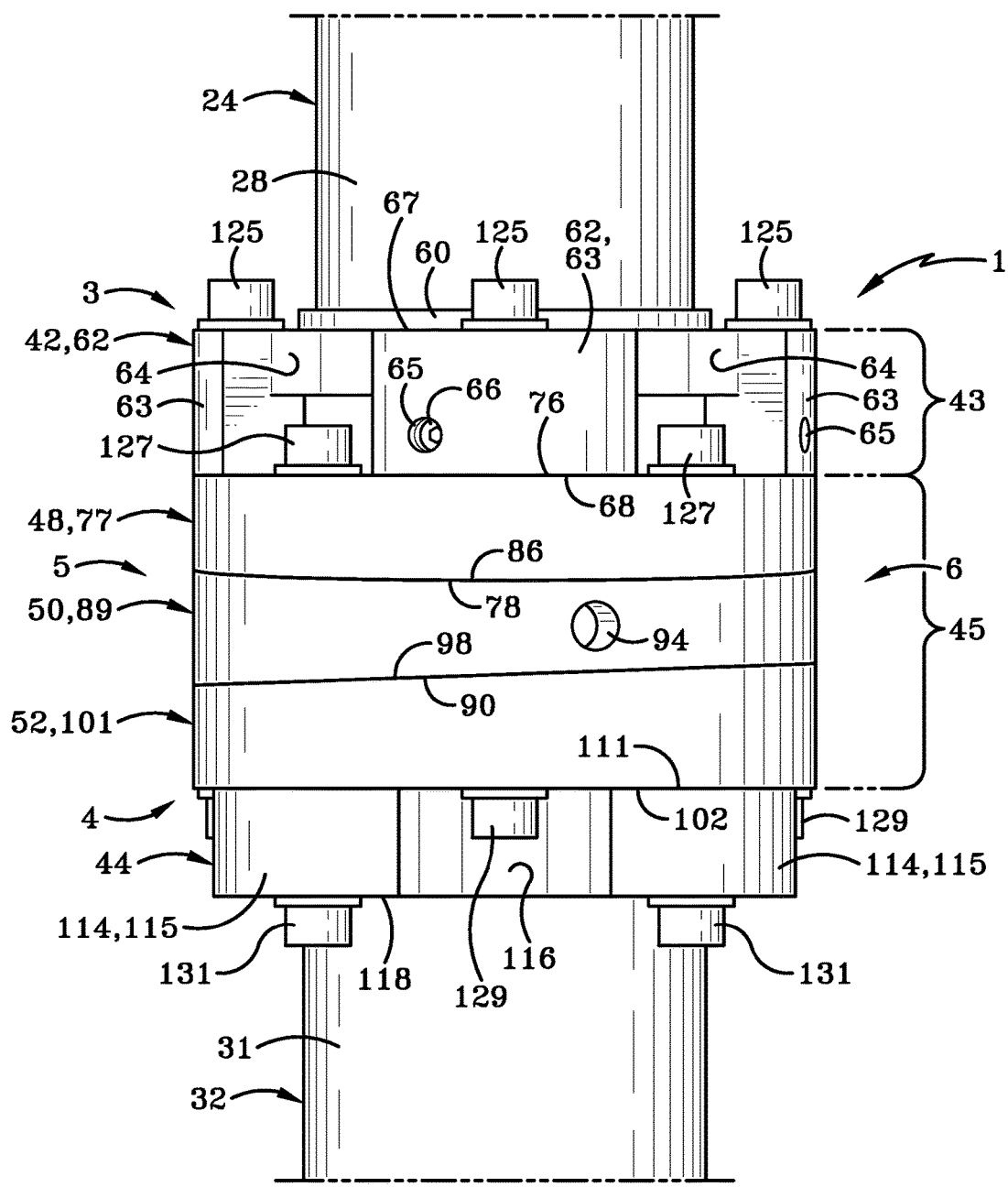
FIG. 5 illustrates a left side elevational view thereof.
Figure 6:
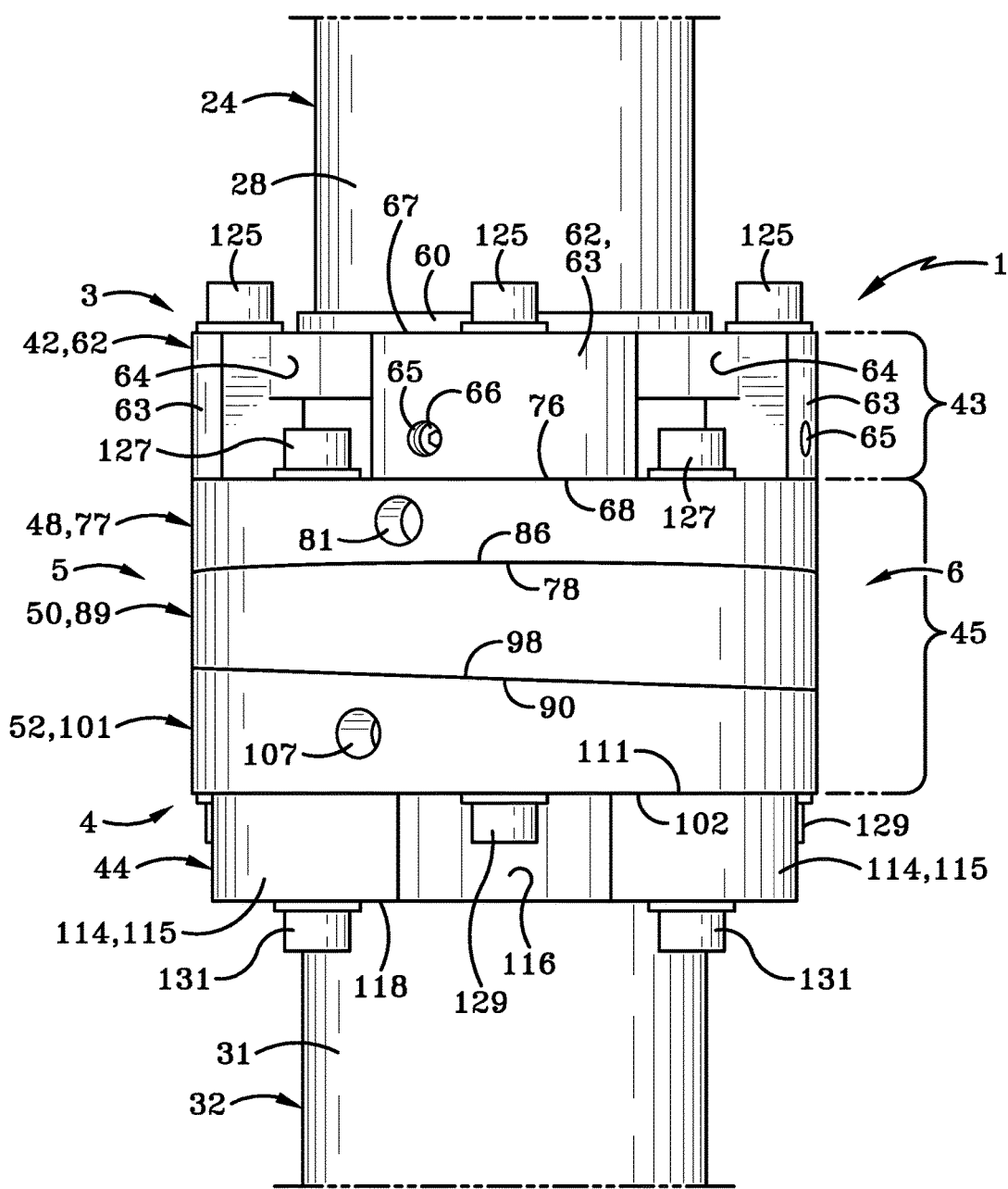
FIG. 6 illustrates a right side elevational view thereof.

As shown in FIG. 3, alignment assembly 1 extends from a first end 3 to a spaced apart second end 4 and from a first side 5 to a second side 6. Alignment assembly 1 is generally comprised of a concentric adjustment assembly 43 and an axial adjustment assembly 45. Alignment assembly 1 is connected to riser shaft 24 proximate first end 3 and is connected to drive shaft 32 proximate second end 4. Concentric adjustment assembly 43 includes a particularly shaped riser flange 42 permanently secured at second end 28 of riser shaft 24. While not part of concentric adjustment assembly 43, drive shaft 32 also includes a particularly shaped drive flange 44 secured at first end 31 of drive shaft 32. In the illustrated embodiment of the present invention, riser flange 42 and drive flange 44 are shown having a particular shape, however, in another embodiment, alignment assembly 1 may be disposed between standard and previously known flanges either on riser shaft 24, drive shaft 32, or both. Flanges of this nature are shown in FIG. 1 as flange 29 and flange 30.

As shown in FIG. 3, axial adjustment assembly 45 is removably secured between riser flange 42 and drive flange 44. In the illustrated embodiment, axial adjustment assembly 45 includes three generally circular plates abutting one another, namely, an upper plate 48, a middle plate 50, and a lower plate 52. Axial adjustment assembly 45 further includes a measurement indicia 54 having a series of spaced apart lines 58 with an upper portion 55 disposed on upper plate 48, a middle portion 56 disposed on middle plate 50, and a lower portion 57 disposed on lower plate 52, these line sets are commonly called a vernier or vernier scale.

As shown in FIGS. 3, 7, 8, and 14, riser flange 42 includes an annular collar 60 extending from an annular lip 61. The exterior of riser flange 42 is defined by a surface 62 and alternating projections 63 and recesses 64. Each projection 63 defines a threaded channel 65 extending from surface 62 through the respective projection 63. A set screw 66 is threadably disposed within each threaded channel 65 and is movable therein by way of axially rotating each set screw 66 with respect to the threads of threaded channel 65. Riser flange 42 further includes a surface 67, a surface 68, and a channel 69 extending therebetween and defined by each respective projection 63. Riser flange 42 further includes a surface 70 which abuts an O-ring 71.

As shown in FIGS. 3, 7, 9, and 14, upper plate 48 includes a collar 73 having a surface 74 and a surface 72, which defines a channel 75. When riser flange 42 and upper plate 48 are secured together, O-ring 71 fits into channel 75 and provides an elastomeric seal between surface 70 of riser flange 42 and surface 72 of upper plate 48. Upper plate 48 also includes a surface 76 and surface 78 with a set of four threaded channels 79 and set of four slots 80 extending therebetween. Upper plate 48 further includes an outer surface 77 and an actuation recess 81 defined therein. Upper plate 48 further defines an annular notch 82.

As shown in FIGS. 3, 7, 10, and 14, middle plate 50 includes a collar 85 extending upwardly from a surface 86. Collar 85 is sized to complementarily fit within annular notch 82 of upper plate 48 when upper plate 48 and middle plate 50 are secured together. Surface 86 and middle plate 50 define an annular channel 87 which is sized to receive an O-ring 88. When upper plate 48 and middle plate 50 are secured together, O-ring 88 provides an elastomeric seal between surface 78 of upper plate 48 and surface 86 of middle plate 50. Middle plate 50 further includes an outer surface 89, a surface 90, and an annular notch 91. Middle plate 50 defines a set of four threaded channels 92 interspersed with a set of four threaded channels 93. Middle plate 50 defines a set of four threaded channels 92 extending from surface 86 to surface 90 through middle plate 50. Similarly, middle plate 50 defines a set of four threaded channels 93 extending from surface 86 to surface 90 through middle plate 50. Each threaded channel 92 is disposed between threaded channels 93 axially around middle plate 50. Middle plate 50 further defines an actuation recess 94 extending therein.

As shown in FIGS. 3, 7, 11, and 14, lower plate 52 includes a channel 97. Channel 97 is sized to complementarily fit within annular notch 91 when middle plate 50 and lower plate 52 are secured together. Lower plate 52 further includes a surface 98. Surface 98 and lower plate 52 define an annular channel 99 sized to receive an O-ring 100 therein. When middle plate 50 and lower plate 52 are secured together, O-ring 100 provides an elastomeric seal between surface 90 of middle plate 50 and surface 98 of lower plate 52. Lower plate 52 further includes an outer surface 101, a surface 102, and an annular notch 103. Lower plate 52 defines a series of four slots 104 extending from surface 98 to surface 102 through lower plate 52. Similarly, lower plate 52 defines a series of four threaded channels 105 extending from surface 98 to surface 102 through lower plate 52. Each slot 104 is disposed between two threaded channels 105 around the circumference of lower plate 52. Lower plate 52 further defines an actuation recess 107 extending therein.

As shown in FIGS. 3, 7, 12, and 14, drive flange 44 includes a collar 110 extending upwardly from a surface 111. Collar 110 is sized to be received in annular notch 103 of lower plate 52 when lower plate 52 and drive flange 44 are secured together. Drive flange 44 defines an annular channel 112 which is sized to receive an O-ring 113 therein. O-ring 113 provides an elastomeric seal between surface 102 of lower plate 52 and surface 111 of drive flange 44 when lower plate 52 is secured to drive flange 44. Drive flange 44 further includes an outer surface 114 disposed on a set of four projections 115 extending outwardly away from collar 110. Each projection 115 is disposed between recesses 116. Each projection 115 defines a slot 117 extending from surface 111 to a surface 118 (FIG. 16).

Figure 9:
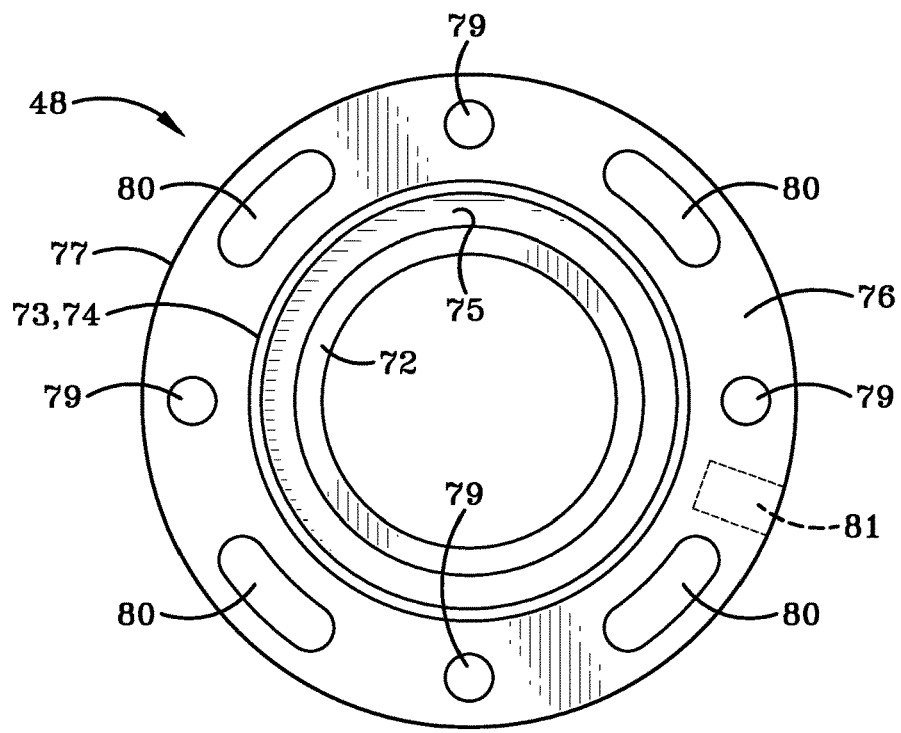
FIG. 9 illustrates a view taken along line 9-9 of FIG. 7.
Figure 14:
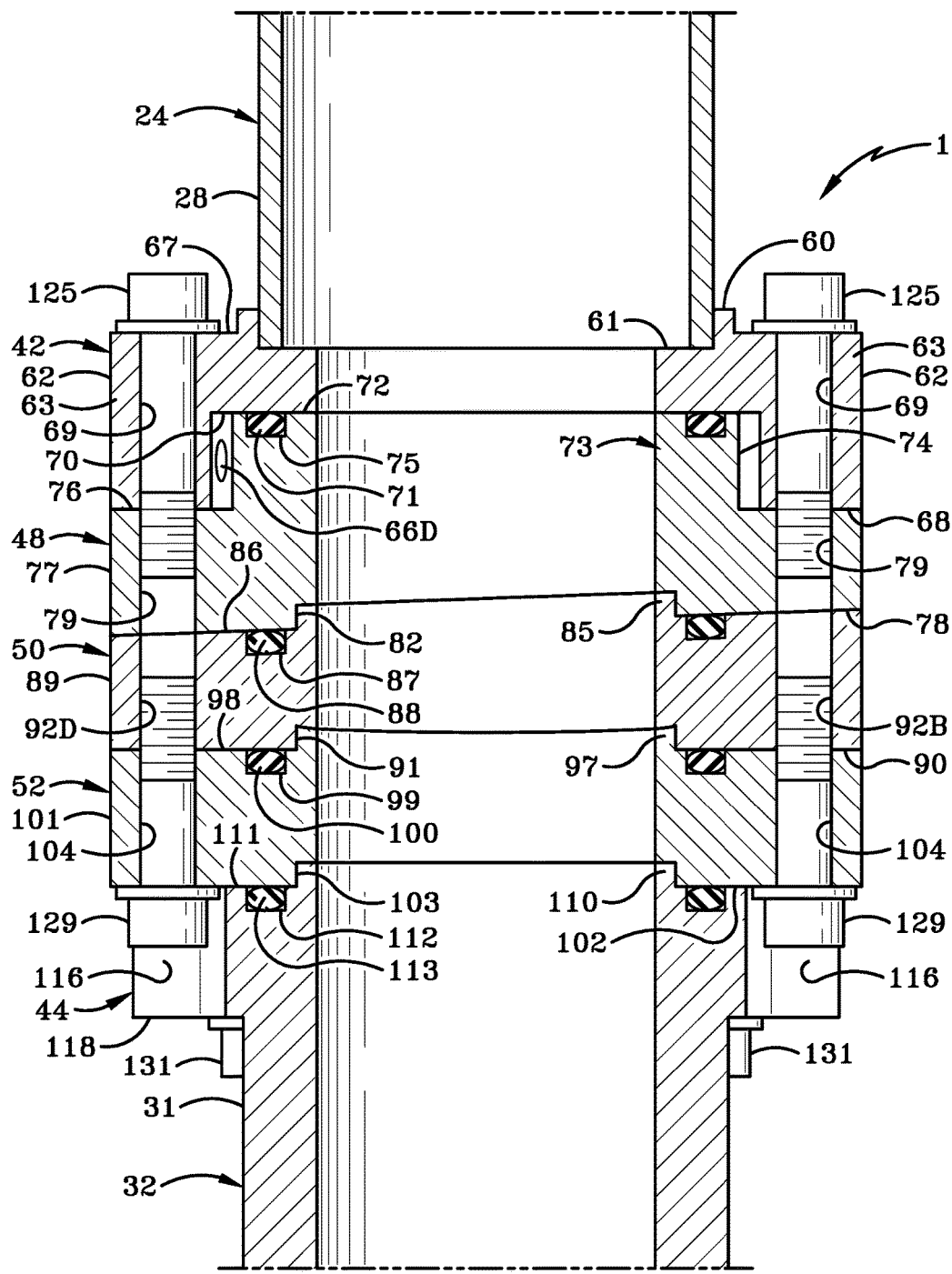
FIG. 14 illustrates a cross-sectional view taken along line 14-14 of FIG. 13.

As shown in FIGS. 3 and 14, a screw 125 is disposed in each channel 69 and is received in the corresponding aligned threaded channel 79 of upper plate 48 to secure upper plate 48 to riser flange 42. As shown in FIGS. 9 and 16, a screw 127 is disposed in each slot 80 of upper plate 48 and receives into the corresponding threaded channel 93 of middle plate 50.

As shown in FIGS. 3, 10, 11, and 14, a screw 129 is disposed in each slot 104 and received in the corresponding threaded channel 92 to secure lower plate 52 to middle plate 50. As shown in FIGS. 3, 11, 12, and 16, a screw 131 is disposed in each slot 117 of drive flange 44 and received in the corresponding threaded channel 105 of lower plate 52 to secure lower plate 52 to drive flange 44.

Figure 8:
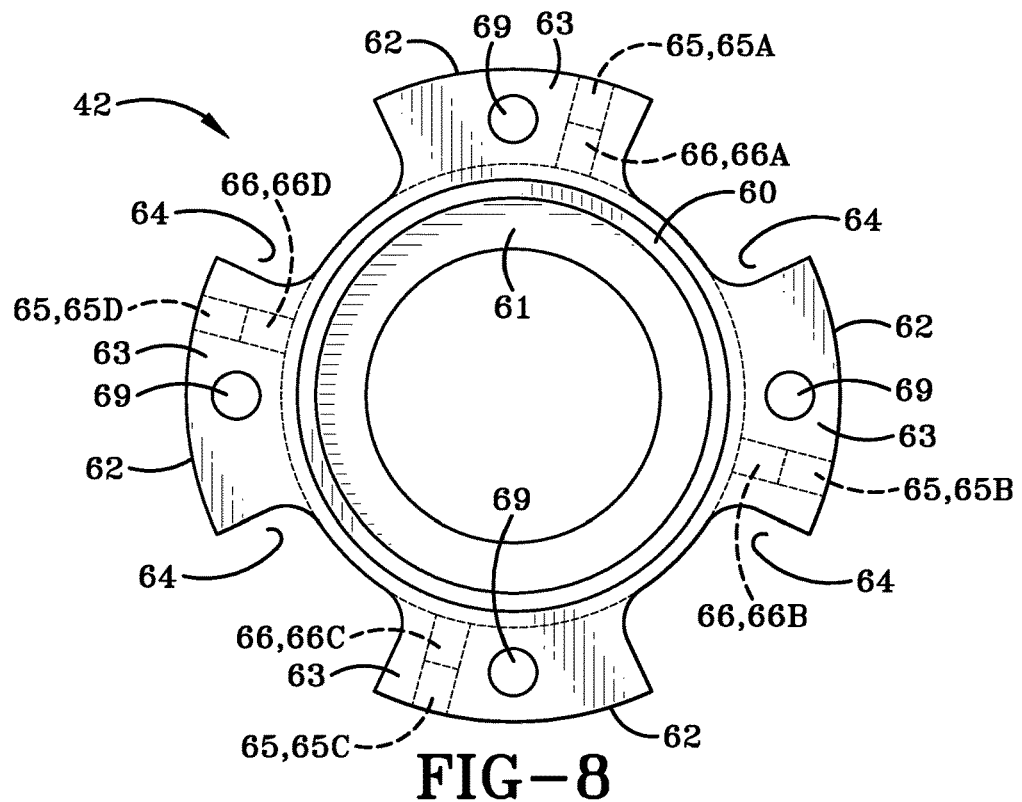
FIG. 8 illustrates a view taken along line 8-8 of FIG. 7.
Figure 10:
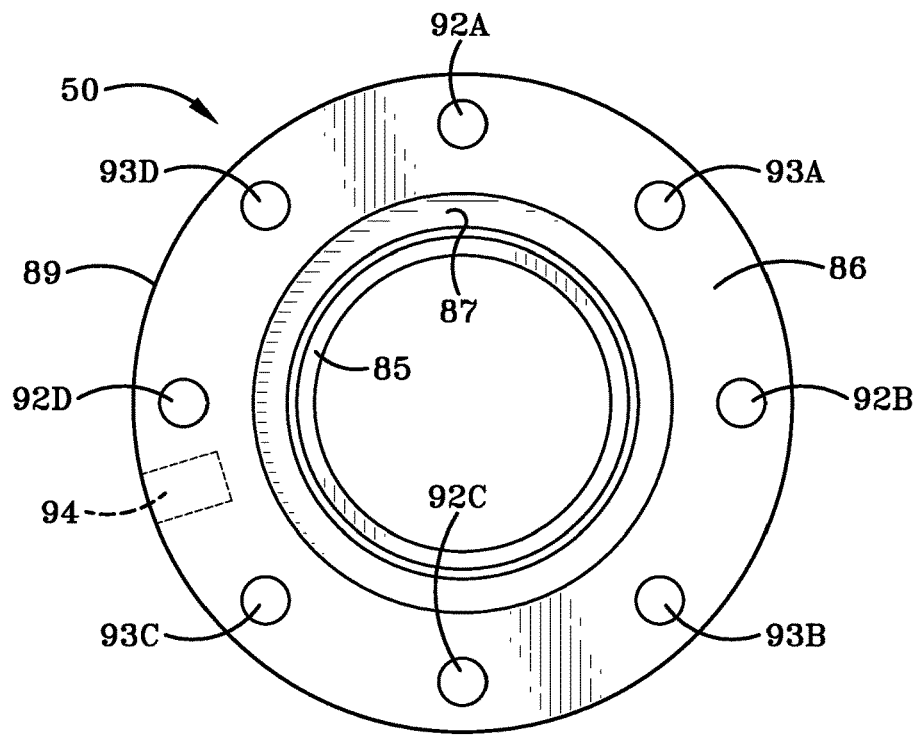
FIG. 10 illustrates a view taken along line 10-10 of FIG. 7.
Figure 16:
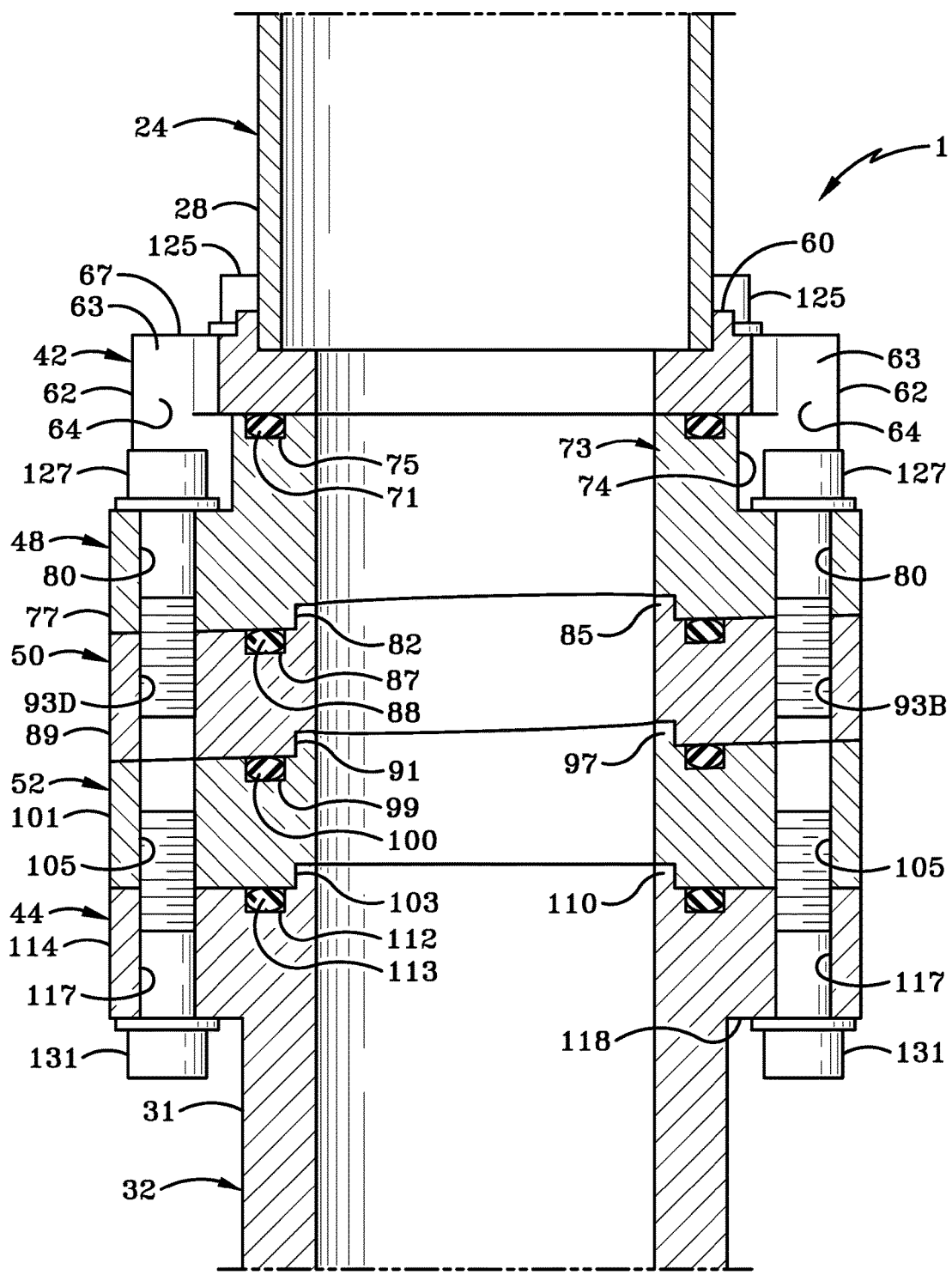
FIG. 16 illustrates a cross-sectional view taken along line 16-16 of FIG. 13.

As shown in FIGS. 8-12, 14, and 16, middle plate 50 and lower plate 42 are configured to axially rotate within alignment assembly 1. This is facilitated by the general use of the aforementioned screws in the aforementioned slots working in conjunction to allow middle plate 50 to axially rotate with respect to upper plate 48 and lower plate 52, as well as allow lower plate 52 to axially rotate with respect to middle plate 50 and drive flange 44. As shown in FIGS. 8, 9, and 14, screws 125 extend through channels 69 of riser flange 42 and into channels 79 of upper plate 48. Channels 69 and channels 79 firmly hold upper plate 48 against riser flange 42. As shown in FIGS. 9, 10, and 16, screws 127 extend through slots 80 of upper plate 48 and into channels 93 of middle plate 50. The overall extended open nature of slots 80 as well as recess 64 of riser flange 42 allow middle plate 50 to pivot axially within alignment assembly 1 by way of slots 80.

Figure 11:
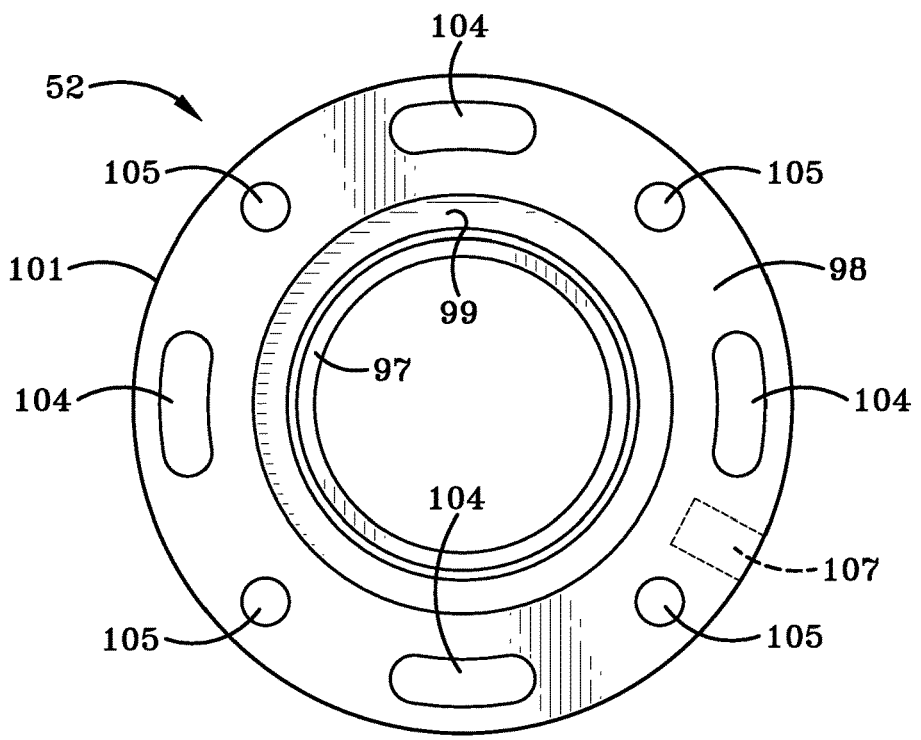
FIG. 11 illustrates a view taken along line 11-11 of FIG. 7.
Figure 12:
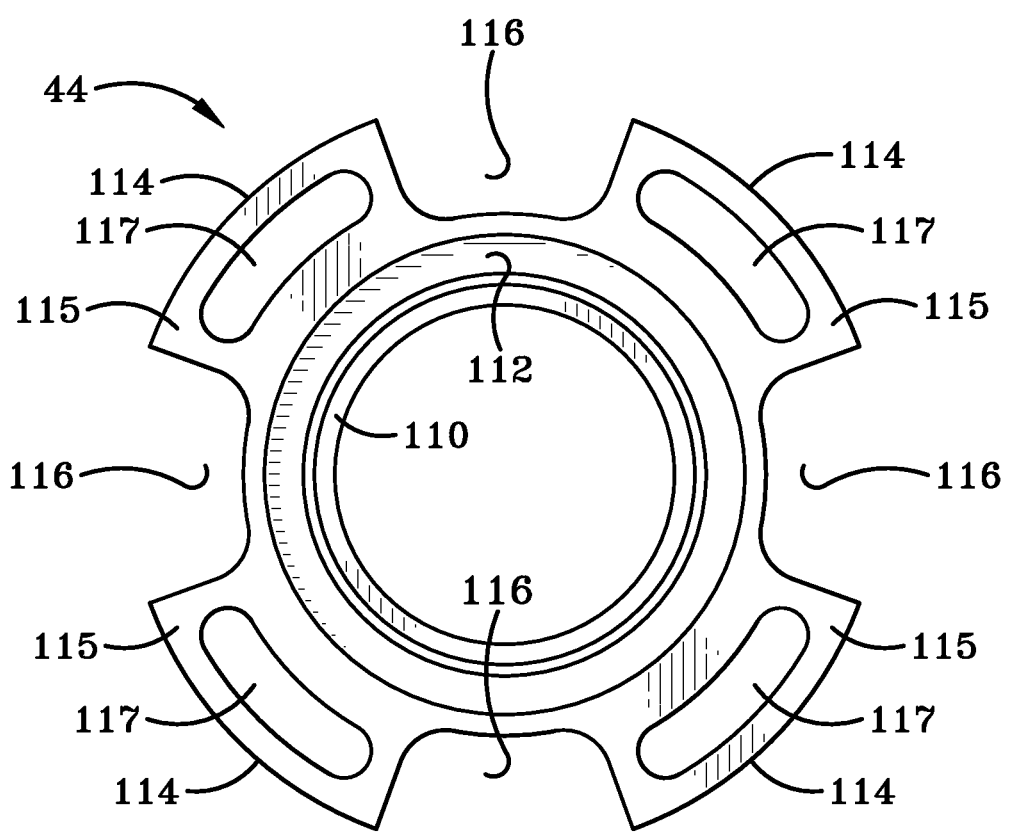
FIG. 12 illustrates a view taken along line 12-12 of FIG. 7.

While screws 127 are firmly held within channels 193 of middle plate 50, the remaining portion of screws 127 moves within slots 80 to allow middle plate 50 to rotate. As shown in FIGS. 10, 11, and 14, screws 129 extend through channels 92 of middle plate 50 and slots 104 of lower plate 52. This correspondingly allows middle plate 50 to rotate by providing slots 104 to allow screws 129 to rotate along with middle plate 50. In a similar fashion, lower plate 52 is also axially rotatable within alignment assembly 1 via the same broad concept. Specifically, as previously discussed, screws 129 extend into slots 104 of lower plate 52, which allows lower plate 52 to pivot about screws 129. Correspondingly, as shown in FIGS. 11, 12, and 16, screws 131 extend into channel 105 of lower plate 52 and slot 117 of Drive flange 44. Slots 117 of drive flange 44 allows screw 131 to pivot about the extended nature of slots 117 within drive flange 44 which in turn allows lower plate 52 to rotate through the entire length of slot 117 via screw 131.

As shown in FIGS. 14 and 16, the various screws of alignment assembly 1 facilitate securing riser flange 42, upper plate 48, middle plate 50, lower plate 52, and drive flange 44 together while still providing an axially rotatable mechanism for middle plate 50 and lower plate 52. Specifically, screws 125 secure riser flange 42 to upper plate 48, screws 127 secure upper plate 48 to middle plate 50, screws 129 secure middle plate 50 to lower plate 52, and screws 131 secure lower plate 52 to drive flange 44. Further, screws 125 secure riser shaft 24 to alignment assembly 1, while screws 131 secure drive shaft 32 to alignment assembly 1.

As shown in FIGS. 3 through 6, upper plate 48, middle plate 50, and lower plate 52 include a non-uniform cross-sectional thickness. As shown in FIG. 3, when viewed from first side 5 to second side 6, the cross-sectional thickness of upper plate 48, middle plate 50, and lower plate 52, changes and is non-uniform. As such, the surfaces between upper plate 48, middle plate 50, and lower plate 52 act as cam surfaces to one another and when axially rotated against one another, change the orientation between riser axis 39 and drive axis 41. A series of actuation recesses are provided within each plate of alignment assembly 1 to provide a simplified way to apply torque to each plate within alignment assembly 1 and easily rotate the selected plate. A user simply inserts a key or an elongated item into each actuation recess and manually applies torque to the associated plate in the desired direction.

Figure 13:
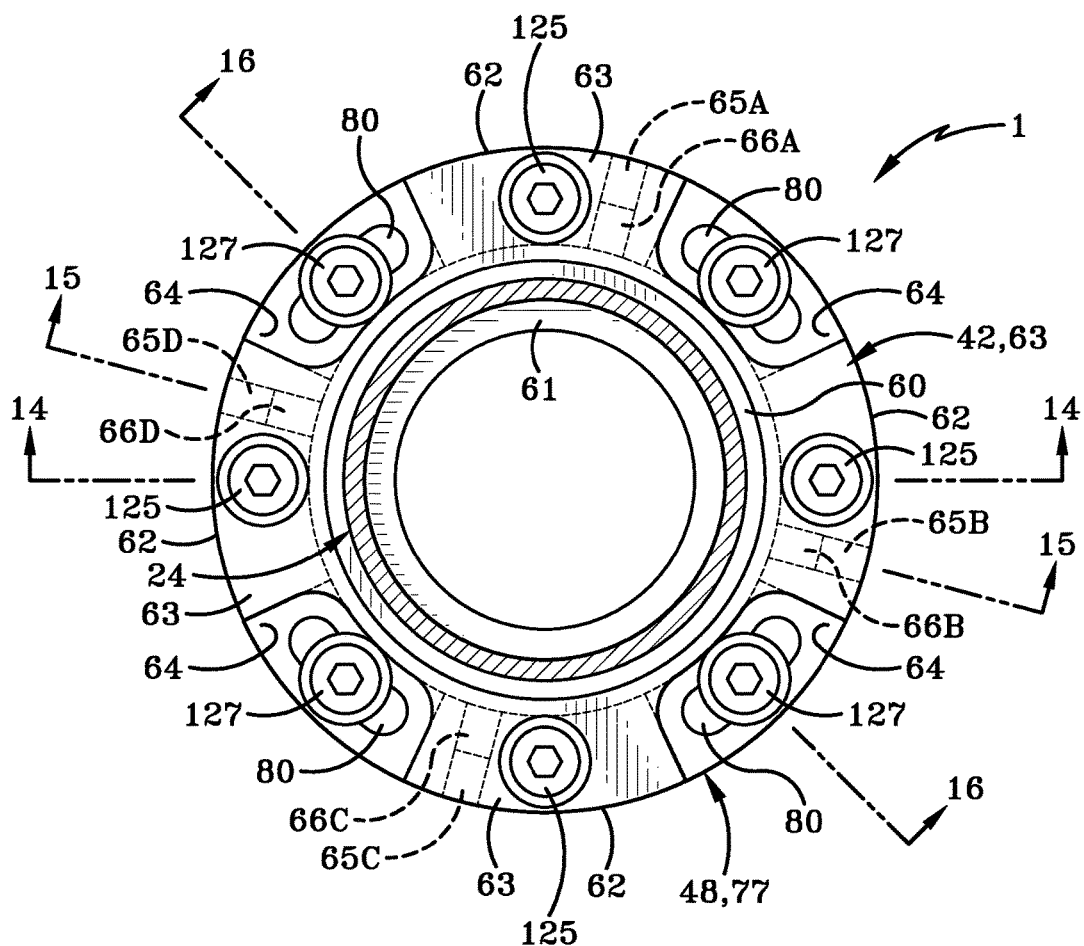
FIG. 13 illustrates a view taken along line 13-13 of FIG. 3.
Figure 15:
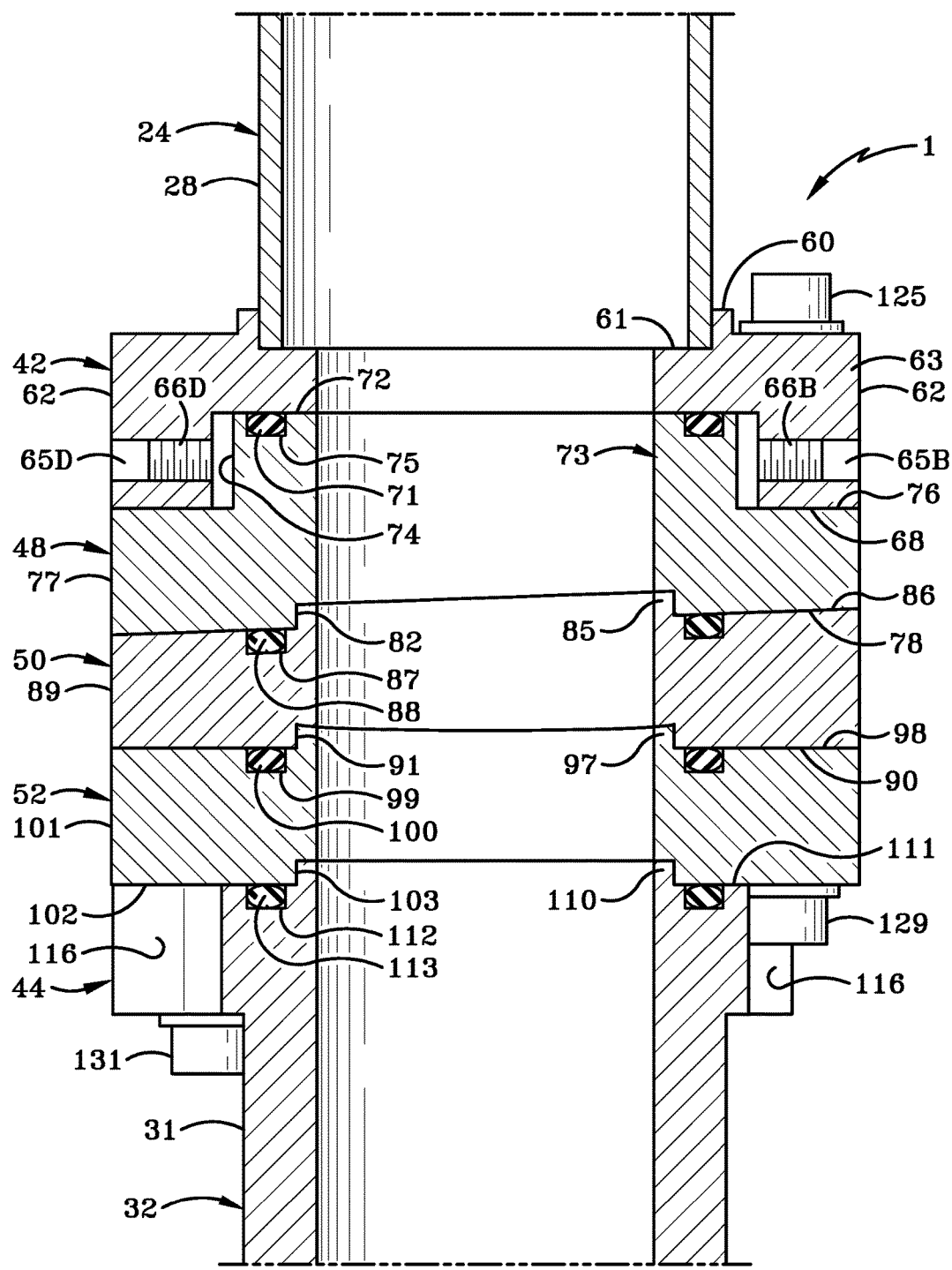
FIG. 15 illustrates a cross-sectional view taken along line 15-15 of FIG. 13.

With respect to lateral adjustment assembly 43, as shown in FIGS. 8, 13, and 15, set screws 66 may be actuated to change the lateral position, when viewed from the front, but is actually a concentric adjustment when looked at from the dynamics of rotation, of riser shaft 24 with respect to drive shaft 32. As shown in FIG. 13, threaded channels 65 are disposed around the circumference of riser flange 42. The threaded nature of threaded channels 65 complement the threaded nature of set screws 66 and allow set screws to be screwed forwards and backwards within threaded channels 65A. As shown in FIG. 15, set screw 66B is disposed in threaded channel 65B and may be rotated therein to move set screw 66B towards surface 74 of collar 73 of upper plate 48. Similarly, set screws 66D disposed in threaded channel 65D may be rotated to move set screw 66D forwards and backwards within threaded channels 65D and may be moved towards surface 74 of collar 73 of upper plate 48. The user may selectively rotate one or more set screws in such a manner as to abut surface 74 and laterally move the entire riser flange 42 laterally along with the abutment of the particular set screw 66. In this way, concentric adjustment assembly 43 may be selectively used to change the orientation between riser axis 39 and drive axis 41.

Figure 17:
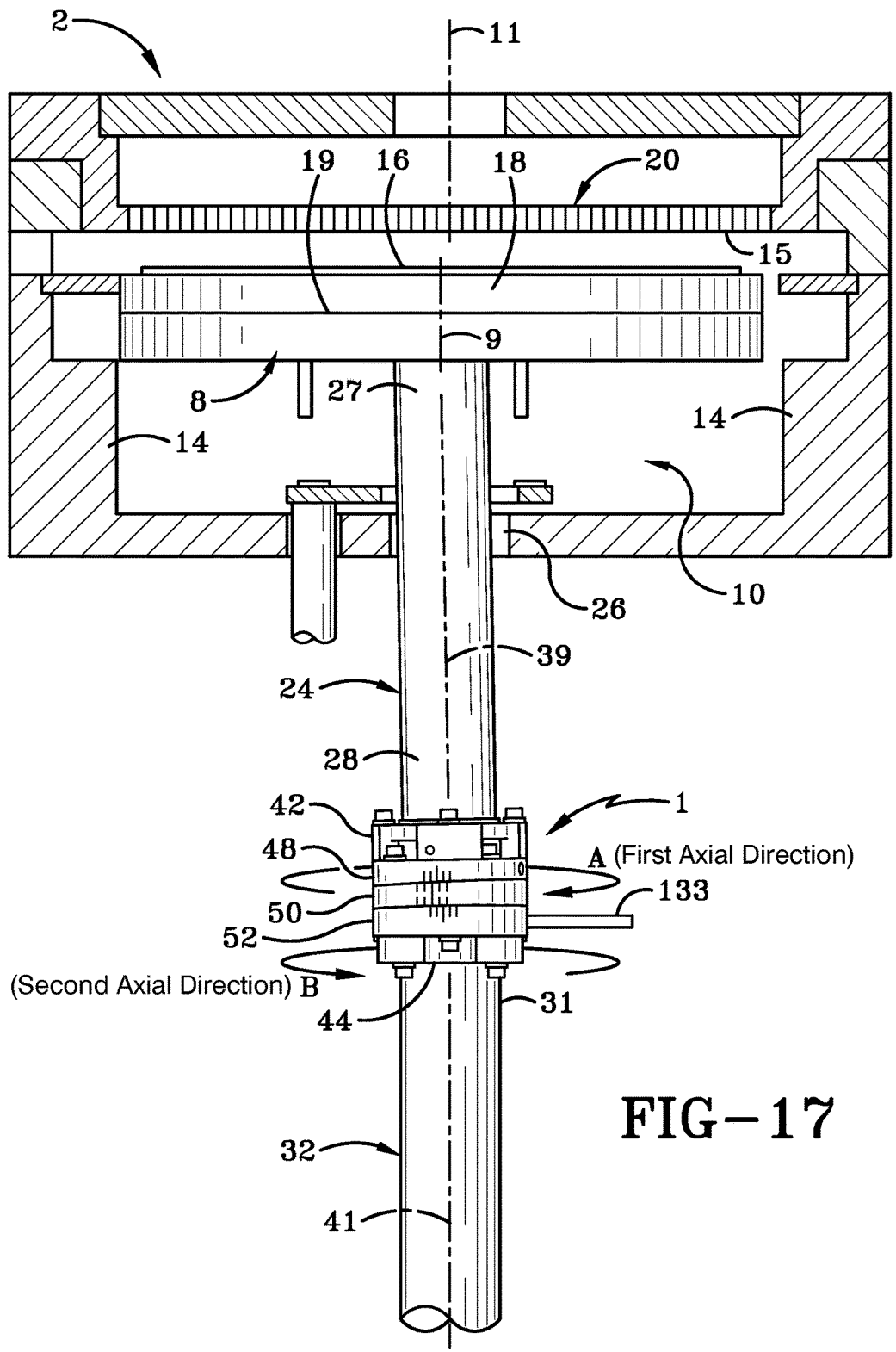
FIG. 17 illustrates a front elevational view similar to FIG. 2.

In operation, inasmuch as upper plate 48, middle plate 50, and lower plate 52 include a non-uniform cross-sectional shape, the various surfaces of these elements interacting with one another may be thought of as camming surfaces for providing linear adjustment of riser axis 39 via the axial movement of one or both of middle plate 50 and lower plate 52. Ultimately, the axial movement of one or both of middle plate 50 and lower plate 52 may be used to more precisely align showerhead surface 15 in a precise parallel relationship with surface 19. As shown in FIG. 17, Arrow A represents movement in a first axial direction, while Arrow B represents movement in a second axial direction. Prior to adjustment via alignment assembly 1, the user installs pedestal assembly 7 into reactor 2. Plate 8 of pedestal assembly 7 is disposed within processing chamber 10 with riser shaft 24 extending through opening 26. This configuration disposes second end 28 of riser shaft 24 proximate first end 31 of drive shaft 32. Inasmuch as riser flange 42 is preferably permanently attached to second end 28 of riser shaft 24, the user may have previously welded or otherwise permanently secured riser flange 42 onto riser shaft 24. Similarly, pedestal assembly 7 may come pre-manufactured having riser flange 42 manufactured already permanently secured to riser shaft 24. Riser flange 42 is secured to upper plate 48 by way of screws 125 extending through channels 69 and being received into channels 79. This removably secures riser flange 42 to upper plate 48. Upper plate 48, middle plate 50, and lower plate 52 are secured together by way of screws 127 extending through slots 80 of upper plate 48 and being received within channels 93 of middle plate 50. Likewise, screws 129 extend through slots 104 of lower plate 52 and are received within channels 92 of middle plate 50. The user then secures flange 44 of drive shaft 32 to lower plate 52 by way of screws 131. Screws 131 extend through slots 117 of flange 44 and are received within channels 105 of lower plate 52 to secure alignment assembly 1 to drive shaft 32. Recesses 64 of riser flange 42 are provided to create space for screws 127 without connecting screws 127 to riser flange 42. Likewise, recesses 116 of drive flange 44 are provided to create space for screws 129 without connecting screws 129 to drive flange 44. As shown in FIG. 17, a key 133 may be provided which is sized to be received within any of the actuation recesses, namely actuation recess 81, actuation recess 94, and actuation recess 107, for use in helping the user axially rotate the selected plate in either first axial direction or second axial direction.

Figure 7:
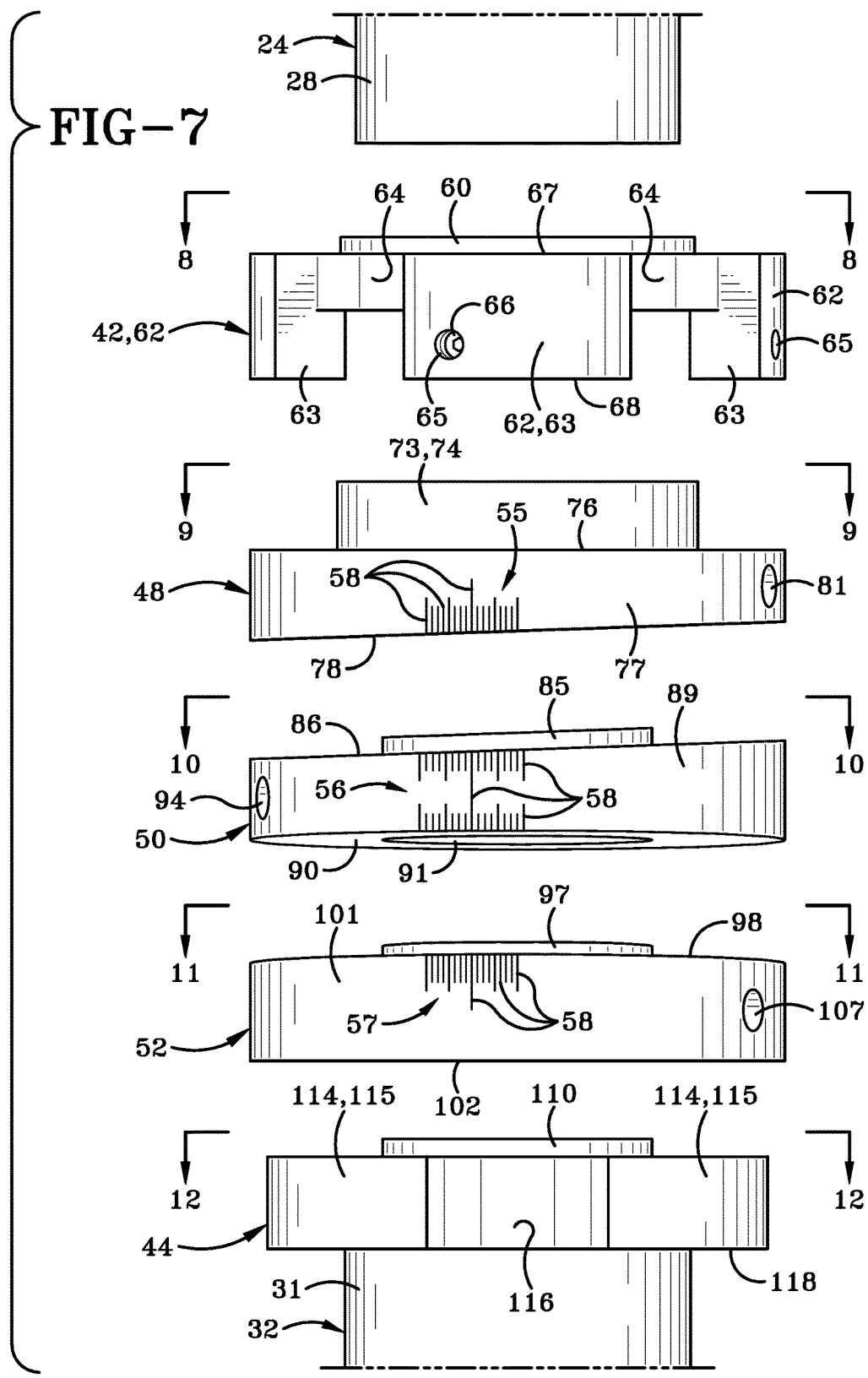
FIG. 7 illustrates a front elevational exploded view thereof.

As shown in FIG. 7, given the non-uniform cross-sectional shape of upper plate 48, surface 78 acts as a cam surface with respect to surface 86 of middle plate 50. Likewise, given the non-uniform cross-sectional shape of middle plate 50, surface 86 of middle plate 50 acts as a cam surface with respect to upper plate 48. Similarly, surface 90 of middle plate 50 acts as a cam surface against surface 98 of lower plate 52. Likewise, given the non-uniform cross-sectional shape of lower plate 52, surface 98 acts as a cam surface with middle plate 50. The cross-sectional areas of upper plate 48, middle plate 50, and lower plate 52 are configured such that alignment assembly 1 may be positioned in a home position whereby the various surfaces of upper plate 48, middle plate 50, and lower plate 52 abut to correspondingly provide a straight and non-angled alignment between upper plate 48, middle plate 50, and lower plate 52. The home position is illustrated in FIG. 17 and is indicated to the user when upper portion 55, middle portion 56, and lower portion 57 of measurement indicia 54 are aligned in the manner shown in FIG. 3. When a user wishes to alter the alignment between upper plate 48, middle plate 50, and lower plate 52, which correspondingly changes the orientation between riser axis 39 and drive axis 41, the user simply inserts key 133 into any of the desired or convenient actuation recesses, namely actuation recess 81, actuation recess 94, or actuation recess 107, and turns the associated plate in either the first axial direction or the second axial direction. For example, the user may wish to move middle plate 50 in the first axial direction. Pursuant to this, the user inserts key 133 into actuation recess 94 and rotates middle plate 50 in the direction of Arrow A (FIG. 17). Middle portion 56 of measurement indicia 54 provides visual feedback to the user as to how far middle plate 50 is turned in the first axial direction with respect to upper plate 48 and lower plate 52. Axial rotation of middle plate 50 cams surface 86 of middle plate 50 against surface 78 of upper plate 48. This camming between upper plate 48 and middle plate 50 alters the orientation between riser axis 39 and drive axis 41. Measurement indicia 54 may be correlated to provide angular feedback with respect to the orientation of riser axis 39 and drive axis 41. Measurement indicia 54 may even be correlated to a third party measurement device which may be used to determine the corrections in angles needed to improve the rotational concentricity between processing chamber 10 of reactor 2 and plate 8 of pedestal assembly 7 disposed therein. This device may rest on surface 19 of heater element 8 to determine how far one of middle plate 50 and lower plate 52 must be turned to provide a more beneficial orientation of pedestal assembly 7. For example, each line 58 within measurement indicia 54 may correlate to one degree of angular changes of heating assembly 7 within processing chamber 10. More particularly, each line 58 may correlate to one degree or another measurement mechanism of angular changes between showerhead surface 15 and surface 19.

Figure 18:
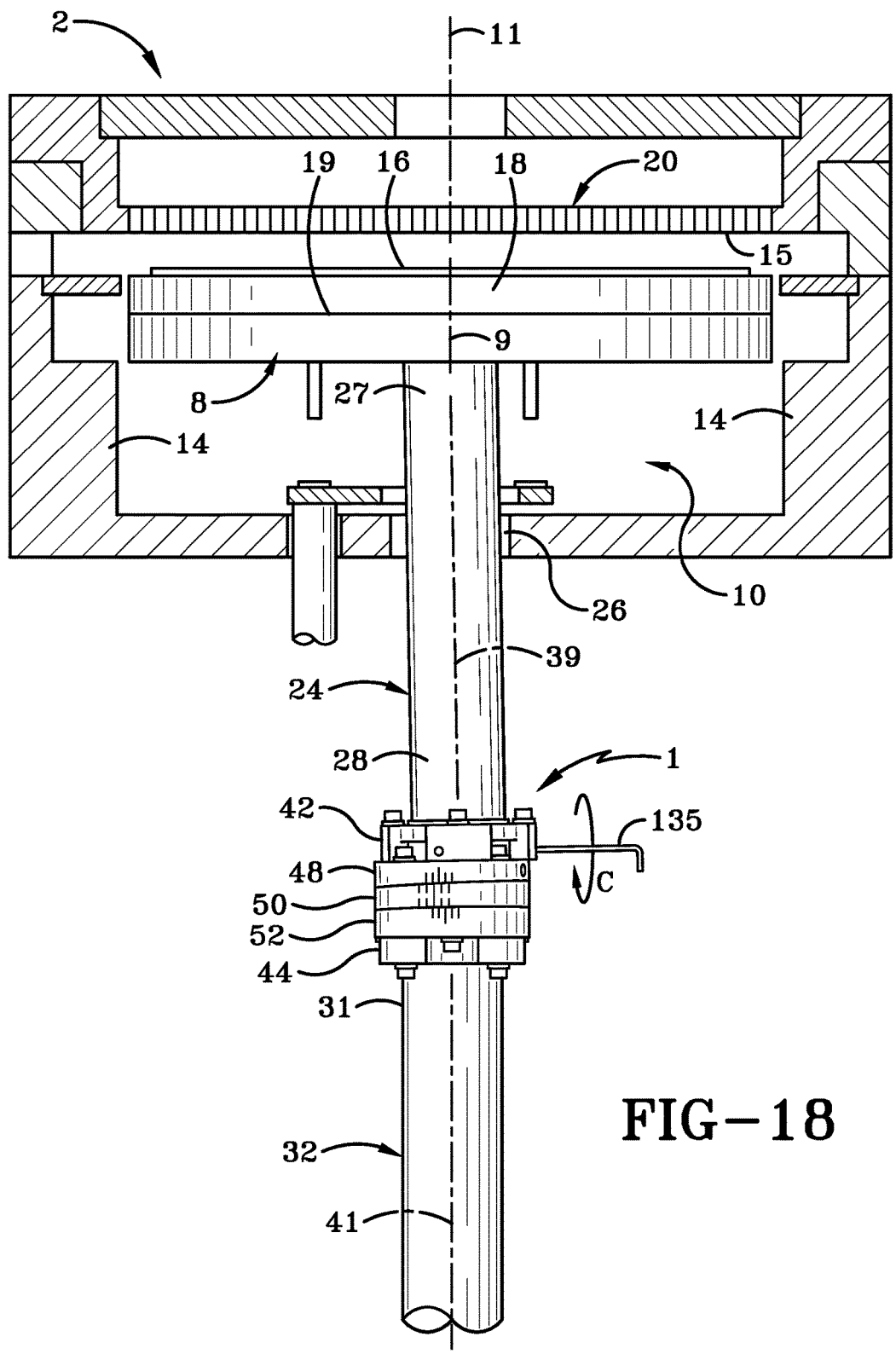
FIG. 18 illustrates a front elevational view similar to FIG. 2.

Turning our attention to FIG. 18, the user may wish to change the lateral placement of riser axis 39 with respect to drive axis 41 to correct concentricity. As such, a key 135 is provided which fits within threaded channels 65 to actuate set screws 66 therein. The user inserts key 135 into the desired threaded channel 65 and moves key 135 in the direction of Arrow C to move set screw 66 either towards surface 74 of upper plate 48 or away from surface 74 of upper plate 48. As described above, set screw 66 may be rotated in such a way that set screw 66 firmly abuts surface 74 of upper plate 48 and pushes riser flange 42 and riser shaft 24 in the respective lateral direction. Once the user adjusts the lateral direction of riser flange 42 as desired, preferably the user inserts key 135 in the remaining threaded channels 65 to actuate the remaining set screws 66 to firmly abut surface 74 of upper plate 48 and firmly secure riser flange 42 to upper plate 48.

Inasmuch as alignment assembly 1 may be adjusted laterally via lateral adjustment assembly 43 or angularly via axial adjust assembly 45, alignment assembly 1 may be used to improve the rotational concentricity between processing chamber 10 of reactor 2 and plate 8 of pedestal assembly 7 disposed therein. As described above, actual rotation of middle plate 50 and/or lower plate 52 changes the orientation between riser axis 39 and drive axis 41, which in turn may reduce the angle between plate 8 and showerhead 20, which provides a more parallel relationship between showerhead surface 15 and surface 19. Likewise, riser flange 42 may be moved in a lateral direction to improve the centering of plate 8 within processing chamber 10 by reducing the distance between axis 9 and axis 11. As such, alignment assembly 1 may be used to reduce or eliminate both radial runout of plate 8 and lateral runout of plate 8 with respect to processing chamber 10.

The particular implementations of alignment assembly 1 shown and described herein are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, any connecting lines shown in the various figures are intended to represent exemplary functional relationships and/or physical couplings between the various elements. Many alternative or additional functional relationship or physical connections may be present in the practical system, and/or may be absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

In the foregoing description, certain terms have been used for brevity, clearness, and understanding. No unnecessary limitations are to be implied therefrom beyond the requirement of the prior art because such terms are used for descriptive purposes and are intended to be broadly construed.

While the present invention has been described in connection with the preferred embodiments of the various figures, it is to be understood that other similar embodiments may be used or modifications and additions may be made to the described embodiment for performing the same function of the present invention without deviating there from. Therefore, the present invention should not be limited to any single embodiment, but rather construed in breadth and scope in accordance with the recitation of the appended claims.

The invention claimed is:

1. A method of changing the relative position of a plate of a pedestal assembly with respect to a processing chamber of a reactor, the method comprising the steps of:
    connecting a riser shaft of the pedestal assembly to a first end of an alignment assembly;
    connecting a drive shaft to a second end of the alignment assembly; and
    rotating a first portion of the alignment assembly about a central axis of the first portion of the alignment assembly to change the relative angle of the plate with respect to the processing chamber;
    wherein the first portion of the alignment assembly comprising a circular plate that has a non-uniform cross-sectional thickness effecting the change of the relative angle of the plate with respect to the processing chamber as the first portion is rotated; and
    wherein the first portion of the alignment assembly is disposed beneath the plate of the pedestal assembly.

2. The method of claim 1, wherein the step of rotating the first portion about the central axis of the first portion further comprises contacting a cam surface of the first portion against a second portion of the alignment assembly to change the relative angle of the plate with respect to the processing chamber.

3. The method of claim 2, further comprising the steps of:
    inserting a key into an actuation recess defined by the first portion; and
    applying force on the key to rotate the first portion about the central axis of the first portion.

4. The method of claim 1, further comprising the step of moving a third portion of the alignment assembly laterally to change the relative lateral position of the plate with respect to the processing chamber.

5. The method of claim 4, further comprising the step of rotating a screw disposed in a channel defined by the third portion to move the third portion laterally.

6. The method of claim 1, further comprising the step of:
    positioning the plate of the pedestal assembly in the processing chamber of the reactor, wherein the plate of the pedestal assembly is disposed at an angle with respect to a showerhead surface of the reactor; and
    rotating the first portion of the alignment assembly about the central axis of the first portion to decrease the angle.

7. The method of claim 6, further comprising the step of rotating the first portion about the central axis of the first portion to cam the first portion against a second portion of the alignment assembly to decrease the angle.

8. The method of claim 7, further comprising the steps of:
    providing the first portion with a non-uniform cross-sectional thickness and a first cam surface;
    providing the second portion with a non-uniform cross-sectional thickness and a second cam surface; and
    rotating the first portion about the central axis of the first portion to cam the first cam surface against the second cam surface to decrease the angle.

9. The method of claim 8, further comprising the steps of:
    inserting a key into an actuation recess defined by the alignment assembly; and
    applying force on the key to rotate the first portion about the central axis of the first portion.

10. The method of claim 1, further comprising the step of:
    positioning the plate of the pedestal assembly in the processing chamber of the reactor, wherein a longitudinal central axis of the plate is spaced at a distance from a longitudinal central axis of the processing chamber; and
    adjusting the alignment assembly to decrease the distance.

11. The method of claim 10, further comprising the step of moving a third portion of the alignment assembly laterally to decrease the distance.

12. The method of claim 11, further comprising the step of rotating a screw within an opening defined by the third portion to move the third portion laterally to decrease the distance.

13. The method of claim 1 further comprising the step of providing feedback of axial adjustment with a vernier scale.

14. The method of claim 1 wherein the plate is disposed in a reaction chamber; and further comprising the step of providing alignment with the alignment assembly at least one of (a) within the reaction chamber and (b) outside the reaction chamber.

* * * * *